United States Patent [19]

Belanger, Jr.

[11] Patent Number: 4,638,937
[45] Date of Patent: Jan. 27, 1987

[54] BEAM LEAD BONDING APPARATUS

[75] Inventor: Thomas D. Belanger, Jr., Clarendon Hills, Ill.

[73] Assignee: GTE Communication Systems Corporation, Northlake, Ill.

[21] Appl. No.: 761,721

[22] Filed: Aug. 2, 1985

Related U.S. Application Data

[63] Continuation-in-part of Ser. No. 725,606, Apr. 22, 1985, abandoned.

[51] Int. Cl.$^4$ .............................................. B23K 37/00
[52] U.S. Cl. ...................................... 228/5.5; 228/4.1; 228/106; 269/21
[58] Field of Search ................... 228/5.5, 4.1, 6.2, 106; 269/21; 156/583.3

[56] References Cited

U.S. PATENT DOCUMENTS

| | | | |
|---|---|---|---|
| 3,574,923 | 4/1971 | Cushman | 228/106 X |
| 3,608,809 | 9/1971 | Cushman | 228/5.5 |
| 3,722,072 | 3/1973 | Beyerlein | 228/180.2 |
| 3,804,319 | 4/1974 | Piechocki | 228/5.5 |
| 3,910,620 | 10/1975 | Sperry | 269/21 X |
| 3,957,185 | 5/1976 | Kauffman et al. | 228/180.2 X |
| 3,964,666 | 6/1976 | Dinella et al. | 228/106 |

OTHER PUBLICATIONS

Sebonia, R. A., Stress Compensating Fixture for Lead Frame Bonder, Western Electric Technical Digest, No. 52, Oct. 1978, pp. 21 & 22.

Primary Examiner—Nicholas P. Godici
Assistant Examiner—Carmine Cuda
Attorney, Agent, or Firm—Robert J. Black

[57] ABSTRACT

A beam lead bonding apparatus for bonding simultaneously, a plurality of beam leads of varying thicknesses to bonding bumps of varying heights on an integrated circuit substrate subject to cracking when subjected to a predetermined bonding force. The substrate is supported on a base with beam leads in alignment with corresponding ones of the bonding bumps. A resilient pad is provided between the substrate and the base and compressed in response to unequal deflections of the substrate when a bonding element is moved in a direction towards the base to bond the beam leads to the bonding bumps. An alternate compliant pad is disclosed together with an alternate structure for distributing bonding energy throughout the bonding substrate and an alternate arrangement for preventing beam lead to substrate shorts.

8 Claims, 6 Drawing Figures

BEAM LEAD BONDING APPARATUS

This application is a continuation-in-part of my application, Ser. No. 725,606, filed on Apr. 22, 1985 now abandoned.

BACKGROUND OF THE INVENTION (1) Field of the Invention

The present invention relates to beam lead bonding apparatus and, more particularly, to a beam lead bonding apparatus employing a compressible pad and protective layer between the substrate being bonded and a base support.

(2) Background Art

In the electrical art it is often necessary, in the manufacture of printed wiring board assemblies utilizing integrated circuits, to connect the integrated circuit substrates to conductors formed on the printed wiring board through the use of strap like connectors commonly called beam leads. In this regard, it is desirable initially to attach beam leads to an integrated circuit substrate. The beam leads may then be attached to the printed wiring board conductors to establish connection to the integrated circuit to other integrated circuits thereby forming an electronic assembly. In the past such device beam leads were individually attached to the integrated circuit substrate using a time consuming laborious manual process.

Improvements have been made to automate the bonding process as is illustrated by U.S. Pat. No. 3,700,156 issued Oct. 24, 1972 to Hermanns which teaches an apparatus including an element for bonding beam leaded devices to a substrate by successively contacting and bonding each of a plurality of beam leads projecting from around periphery of a beam leaded device. The bonding head is moved in a complex wobbling fashion to individually and successively automatically bond each lead to the substrate which reduced time and labor. Additionally, the wobble bonder of Hermanns allowed for variations in beam lead thicknesses.

While operating generally satisfactorily, the wobbling action has been achieved only through the use of a complex mechanical arrangement which is expensive to manufacture. Additionally, the sequential bonding of the beam leads has frequently resulted in tensile stresses being set up within the leads thereby contributing to early device failures.

Another arrangement for bonding leads of a device equipped with beam leads to substrates is taught by U.S. Pat. Nos. 3,442,432 and 3,475,814 issued May 6, 1969 and Nov. 4, 1969, respectively, to Santagini. Santagini teaches a method and apparatus for the simultaneous bonding of device beam leads to a substrate utilizing a bonding tool which applies pressure and bonding energy simultaneously to all of the leads being bonded. A moveable ball is located within a bore formed in a base which initially supports the substrate. The ball is raised to engage, lift, and pivotly support the substrate above the base surface in contact with a plurality of beam leads which are positioned between the substrate and a bonding head. The substrate pivots about the moveable ball to compensate for unequal beam lead thicknesses while at the same time permitting the simultaneous bonding of all the beam leads thereby preventing the creation of axial stresses within the leads.

Such an arrangement, while operating generally satisfactorily, has been found to cause substrate fracture due to the concentration of force at a central point of the substrate.

Additionally, the above art, while related to the subject invention, addresses the problem of attaching beam lead equipped devices to substrates and not the problem of attaching beam leads to integrated circuit substrates.

Accordingly, it is a object of the present invention to provide a new and useful beam lead bonding apparatus that provides the benefit of simultaneously bonding a plurality of beam leads of varying thicknesses to an integrated substrate while preventing fracture of the substrate to a greater degree than found in previously utilized designs.

BRIEF SUMMARY OF THE INVENTION

The present invention overcomes the above problems by providing a beam lead bonding apparatus which includes an elastically compressible pad positioned between a substrate support and an integrated circuit substrate to which a plurality of beam leads of unequal thickness are to be bonded. The beam leads are positioned in alignment with a respective one of a plurality of bonding bumps which may be of varying height and positioned on an upper side of the substrate. A bonding head is included to engage the beam leads and apply a bonding force and optionally bonding energy to the leads.

Alternate embodiments include the use of a flexible but inelastic bladder to provide compliancy without resiliency and a thermally conductive plate between the substrate and the resilient pad energy conducted to one of the bonding bumps from the bonding element to the other bonding bumps through the substrate. Finally, an alternate embodiment is included to properly form and position bumps with a sloping upper surface to thereby prevent beam lead to substrates short circuits.

BRIEF DESCRIPTION OF THE DRAWINGS

The objects and advantages of a bonding apparatus in accordance with the present invention will be apparent from the following description taken in conjunction with accompanying drawing in which.

DESCRIPTION OF PREFERRED EMBODIMENT

Figure 1:
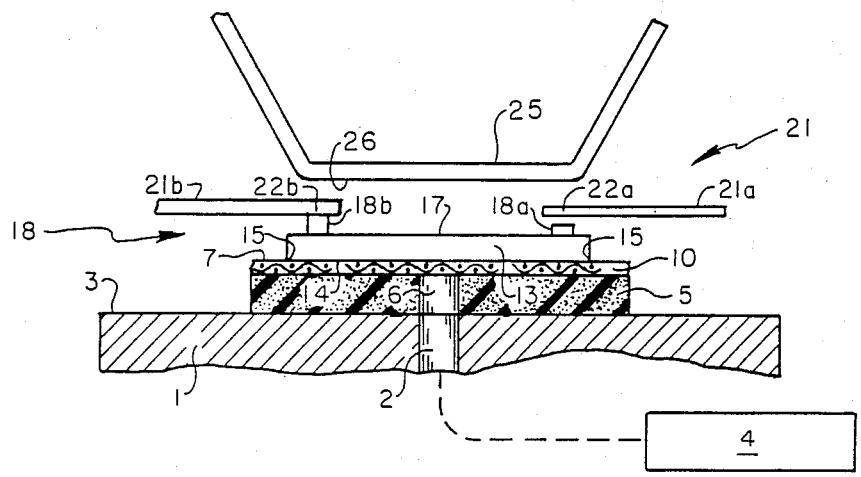
FIG. 1 is an elevational view of the bonding apparatus of the present invention prior to a bonding cycle.

Referring now to FIG. 1 there is shown a bonding apparatus in accordance with the present invention including a base 1 having a central bore 2 formed therein extending to an upper surface 3 of the base 1. The bore 2 is connected to a source of vacuum 4. The vacuum source 4 is shown in block form only in as much as the details thereof do not form a part of the present invention.

A resilient pad 5 of elastically compressible material, rubber for example, is positioned on the upper surface 3 of the base 1 and includes a central bore 6 therethrough positioned in alignment with the central bore 2 of the base 1. A protective layer 10 of wire mesh is positioned on an upper surface 7 of the pad 5.

An electronic substrate 13 is included and positioned with a lower surface 14 thereof in contact with the protective layer 10. The lower surface 14 is bounded by a plurality of lower edges 15 frequently found to be very sharp. The protective layer 10 is provided between a substrate 13 and the pad 5 to prevent laceration of the upper surface 7 of the pad 5 by the sharp edges 15 of the lower surface 14.

The substrate 13 includes an upper surface 17 having a plurality of bonding bumps or pads 18 formed thereon. It should be understood that although the bonding bumps 18 have been placed at the periphery of the substrate 5 for illustrative purposes, the bumps may be placed anywhere on the upper surface 17. Additionally, the bonding bumps 18 may be of varying heights. In this regard, there is shown a short bonding bump 18a and tall bonding bump 18b formed on the upper surface 17 of the substrate 13. A corresponding plurality of beam leads 21 may be provided, each including a bonding end positioned in alignment with a corresponding bump. The beam leads may be of unequal thickness. In this regard, FIG. 1 shows a beam lead 21a of narrow thickness having a bonding end 22a and a beam lead 21b of greater thickness having a bonding end 22b, the bonding ends 22a and 22b each positioned in alignment with a corresponding bump (18a and 18b).

A bonding element 25 is positioned above the beam lead bonding ends 22a and 22b. The bonding element 25 includes a lower bonding surface 26 positioned to engage the beam lead bonding ends 22a and 22b.

The present invention may be operated by first placing the integrated circuit substrate 13 on the protective layer 10 of the bonding apparatus of the present invention. Following the placement of the substrate 13 on the protective layer 10, the source of vacuum 4 is energized to evacuate the central bores 2 and 6 of the base 1 and pad 5 respectively and exert a suction force on the lower surface 14 of the substrate 13 to thereby retain the substrate in position. The vacuum created by the vacuum source 4 will spread out within the porous structure of the protective layer 10 forming a pressure gradient from atmospheric pressure at the edges 15 of the substrate 13 to the pressure of the vacuum source 4 at the bore 6 of the pad 5. This pressure gradient, will produce pressures which will vary with location and are distributed over the lower surface 14 of the substrate 13 thereby providing an increased holding force on the substrate 13 as compared to the force which would be exerted on the substrate 13 without the protective layer 10.

Following positioning of the substrate 13, the beam leads 21 are positioned with their bonding ends (represented in FIG. 1 by reference numerals 22a and 22b) above and in alignment with their respective bonding bumps 18a and 18b.

Figure 2:
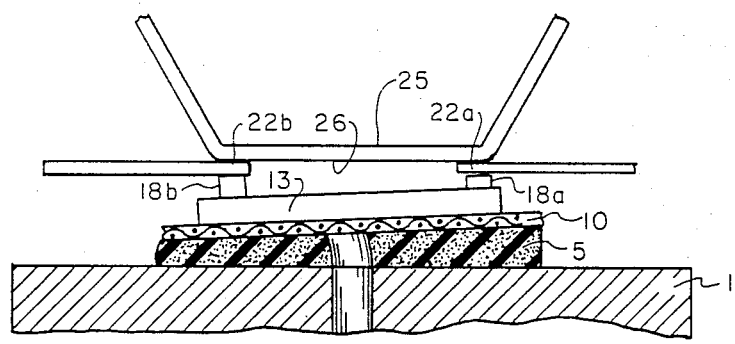
FIG. 2 is an elevational view of the IO present invention during a bonding cycle.
Figure 3:
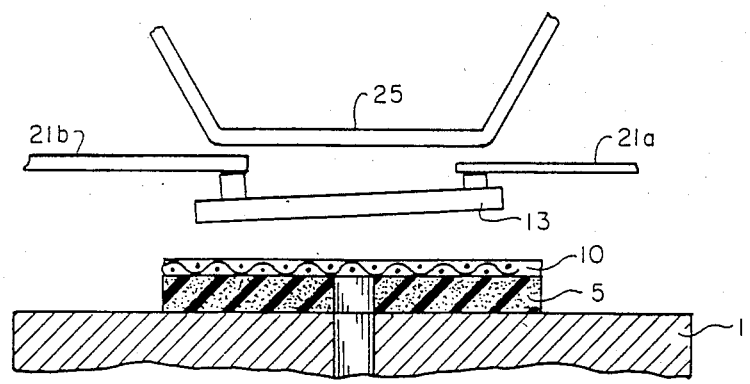
FIG. 3 is an elevational view of the present invention following a bonding cycle.

Referring now to FIG. 2, the bonding element 25 is moved in a direction towards the base 1 to engage the bonding ends 22 of the beam leads 21. As a result of the unequal thicknesses of the bonding bumps 18 and the beam lead bonding ends 22, the bonding element surface 26 will contact and exert a compressive force on the bonding end 22b and the bonding bump 18b before exerting a bonding force on the beam lead bonding end 22a and bonding bump 21a.

The continued movement of the bonding element 25 in a direction towards the base 1 will result in the elastic compression of the pad 5 in the area proximate to and below the bonding bump 18b thereby permitting the substrate 13 to tip thus preventing the buildup of excessive forces in the substrate 13 which would otherwise cause the substrate 13 to crack. The tipping movement of the substrate 13 under the continued movement of the bonding element 25 towards the base 1 will permit the lower surface 26 of the bonding element 25 to engage beam lead bonding end 22a and thereafter, upon the continued movement of the bonding element 25, will permit the bonding end 22a to contact the bonding bump 18a without fracturing the substrate 13. At this point, bonding energy such as heat or ultrasonic energy may be applied by bonding element 25 to the beam lead bonding ends 22a and 22b and bonding bumps 18a and 18b.

Following the application of bonding force and optionally bonding energy to bond the beam leads to the bonding bumps, the bonding element is moved in a direction away from the base 1 thereby permitting the pad 5 to elastically restore to its original shape in preparation for a subsequent bonding cycle.

While operation of the subject invention has been described with respect to bumps and beam leads of unequal thickness, it will be readily appreciated that a substrate of unequal thickness or a bonding element not parallel to the base can be equally well accommodated. In this regard, compression of the pad 5 will occur not only to compensate for bonding bumps 18a and 18b and beam leads 22a and 22b of unequal thickness but also for unequal thickness in the substrate 13 and additionally for angular orientation of the bonding element 25 with respect to the upper surface 3 of the base 1.

Figure 4:
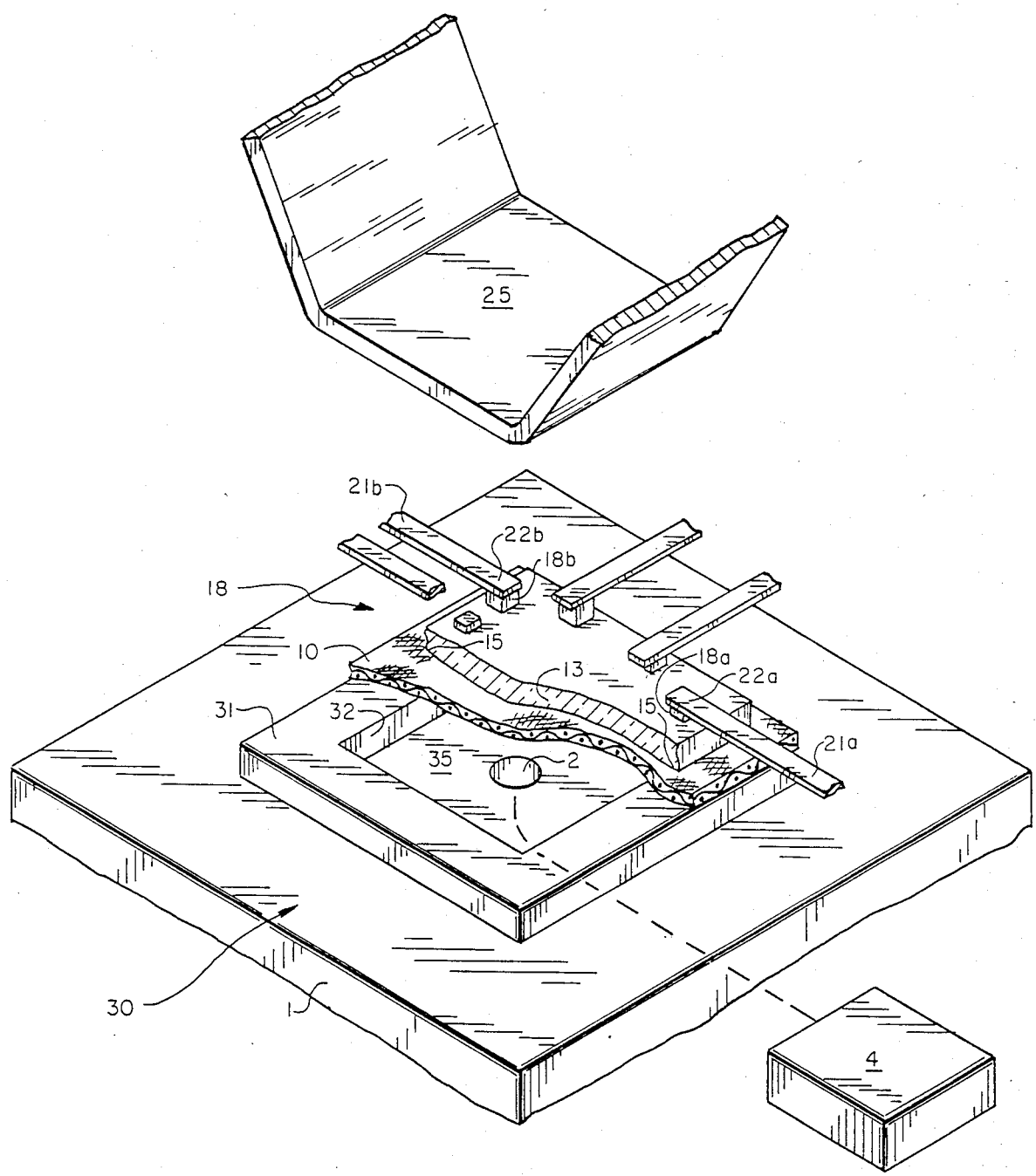
FIG. 4 is a perspective view of the present invention prior to a bonding cycle showing an alternate pad configuration.

An alternate embodiment of the resilient layer in accordance with the present invention may be employed to increase the compliancy of the pad while at the same time increasing the vacuum hold on the integrated circuit substrate. In this regard and referring to FIG. 4, there is shown an alternate embodiment of the present invention including a modified pad 30 of rectangular ring construction including an upper surface 31 and an inner wall 32. The pad 30 is positioned only between the bas ⒺⓇ1 and the substrate 13 beneath the protective layer 10 in the area immediately below the bonding bumps 18. The pad 30, base 1, and substrate 13 define a cavity 35 below the substrate 13. Upon the application of vacuum from the vacuum source 4, air will be drawn from the caVity 35 causing a corresponding force to be exerted on the substrate 13 by the atmosphere. As a result of the cavity 31 a pressure gradient created by the vacuum source 4 will be created as described above. However, the pressure gradient here will be restricted to the area between the substrate edges 15 and the inner wall 32 leaving a greater area, that of cavity 35, to exert the full force effect of the vacuum source 4 on the substrate 13 thereby exerting a greater force on the substrate than in the previous embodiment.

Additionally, the reduced area of the resilient pad 30 supporting the substrate 13 will permit a greater compressive deflection of the pad for a given force exerted on it by the substrate 13 thereby resulting in increased compliancy of the pad. Further, the supportive force of the pad 30 will be exerted on the substrate 13 at points where force is exerted on the substrate 30 by the bonding element 25 and not in the central area of the substrate where the bonding element 25 exerts no force thereby minimizing forces tending to crack the substrate 13.

Figure 5:
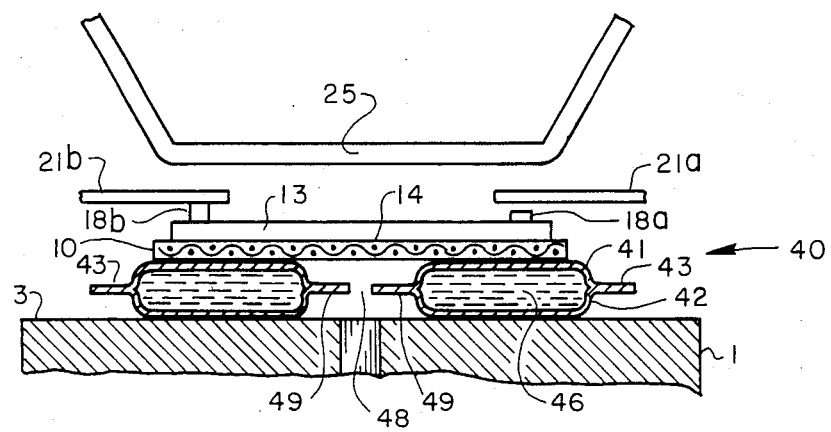
FIG. 5 is an elevational view of the present invention showing an alternate pad embodiment.

Referring now to FIG. 5, there is shown another alternate embodiment of the resilient layer in accordance with the present invention including an alternate pad 40 including an upper membrane 41 and a lower membrane 42, both membranes sealed together in a seam 43 along their peripheries to form bladder. The membranes 41 and 42 may be beneficially flexible and inelastic. Enclosed between the upper membrane 41 and the lower membrane 42 is a material 46 which is of liquid consistency during operation of the subject invention. The compliant pad 40 may initially include within its periphery an aperture 48. To prevent the escape of the compliant material 46 from the aperture 48 the upper membrane 41 and the lower membrane 42 may be sealed together at a second seam 49. The support pad 40 thus formed has been found to be very compliant to nonparallel conditions between the upper surface 3 of the base 1 and the lower surface 50 of the base 1 while exhibiting insensitivity to compressive forces. In this regard, the pad 40 has been found to adjust to inequalities of thickness between the beams and bumps 21b and 18b, and 21a and 18a in such a manner that the force exerted on the "a" and "b" beams and bumps is equal and determined by the force exerted by the bonding element 25. In contrast, the resilient pad shown in FIG. 1 has been found to exhibit a force on the "a" and "b" beams and pads which is proportional to the force exerted by the bonding element 25 and the extent to which the pad 5 is compressed beneath each beam and bump pair.

Continuing to refer to FIG. 5, a further modification of the pad 40 may be realized by employing an elastic material to form either the upper membrane 41 or lower membrane 42 or both membranes. Such an arrangement has been found to exhibit and also to include, by virtue of the elasticity of the upper and lower membranes 41 and 42, resiliency.

Referring again to FIG. 1, the use of thermal bonding energy, as noted above, may be used to enhance beam lead bonding, but such use is beneficial only if carefully controlled. In this regard, a common problem in using thermal energy to assist in bonding beam leads is the uneven conduction of such energy from the bonding head 25 to the base 1 through the beam leads 21, bonding bumps 18, and substrate 13 being bonded. The present invention assists in controlling such thermal energy conduction by providing a thermal barrier consisting of the protective layer 10 and the resilient pad 5 between the substrate 13 and the base 1. In such an application, it is been found advantageous to construct the pad 5 from a high temperature rubber such as silicone rubber and the protective pad from a metallic mesh resistant to high temperatures and corrosion such as stainless steel wire mesh. When so constructed the present invention has been found to promote uniform and simultaneous heating of all contacted beam lead bonding ends and bonding bumps.

Figure 6:
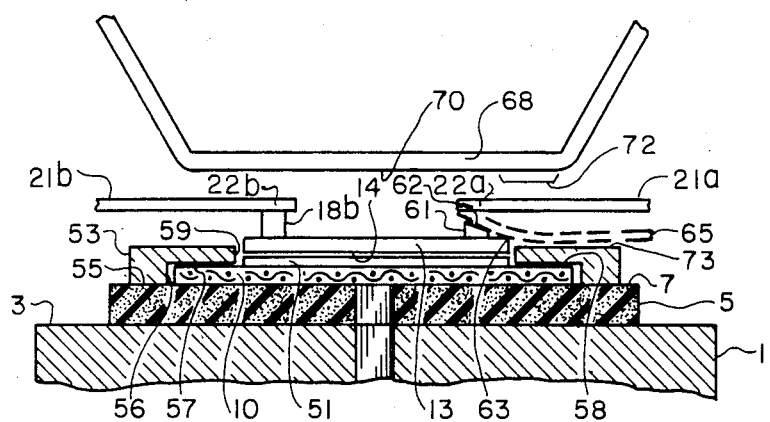
FIG. 6 is an elevational view of the present invention showing an alternate embodiment including a heat distribution and a beam lead clamping and forming arrangement.

Referring now to FIG. 6, there is shown another alternate embodiment of the present invention adapted to further promote uniform and simultaneous heating of all contact lead beam bonding ends and bonding bumps while simultaneously preventing conduction of heat to the substrate support. In this regard, the present embodiment includes a thermally conductive plate 51 positioned between the lower surface 14 of the substrate 13 and the protective layer 10. A retainer 53 of inverted L-shaped cross-section is provided around the perimeter of the protective layer 10. The retainer 53 includes a lower surface 55 in contact with the upper surface 7 of the resilient pad 5, a lower vertical surface 56 circumferentially enclosing the protective layer 10, an intermediate horizontal surface 57 positioned proximate an upper surface 58 of the protective layer 10 and an upper vertical surface 59 circumferentially enclosing the substrate 13 and the conductive layer 51. The retainer 53 is attached by means of the lower surface 55 to the upper surface 7 of the resilient layer 5 by known means such as adhesive bonding. When so attached, the retainer 53 will captively position the protective layer 10 on the upper surface of the resilient layer 5. The conductive layer 51 is removably positioned on the upper surface of the protective layer 10 by means of the circumferential surface 59 thereby permitting replacement of the conductive surface when such becomes necessary.

In operation, when the bonding element (reference numeral 68 in FIG. 6) is activated to apply thermal bonding energy to the beam lead bonding ends 22a and 22b, the thermal energy will be conducted through the bonding ends 22b, the bonding bumps 18b, the substrate 13 and into the conductive plate 51. The thermal energy will then travel throughout the conductive plate 51 including the area below the bonding bump 61 where it will again be conducted through the substrate 13 to the bonding bump 61 thereby heating the bump from the substrate 13 and by direct conduction of thermal energy from the bonding element 68 through the beam lead bonding end 22a.

The present embodiment additionally may be adapted to prevent beam lead shorts to the substrate, which shorts have been found to occur on occasion. In this regard and referring to FIG. 6, there is shown a bonding bump 61 of slightly irregular shape having an upper surface 62 sloping in a direction towards an outer edge 63 of the substrate 13. In the process of bonding beam leads to such bonding bumps, it has frequently been found that the beam lead will be deflected downward and develop a short circuit to the substrate. In this regard, the beam lead 21a, upon being bonded to the bonding bump 61 via the sloping upper surface 62 will be deflected downward, develop a short circuit to the edge 63 of the substrate 13 and assume a deflected position 65 (shown in phantam line). rendering the substrate useless.

The present embodiment, shown in FIG. 6, may be utilized to prevent such beam lead shorting by including therewith a modified bonding element 68 of increased bonding area. In this regard, the lower surface 70 may be increased so as to overlap the retainer 53 forming a clamping zone 72 between the lower surface 70 of the bonding element 68 and an upper surface 73 of the retainer 53.

In operation, when a bonding beam lead is bonded to a bonding bump with a sloping surface such as might cause a beam-lead-to-substrate short, clamping action between the bonding element and the retainer will deflect and position the beam lead in such an orientation as to prevent beam lead to substrate shorting. In this regard, when the beam lead 21a is bonded to the bonding bump 61 including the sloping upper surface 62, the increased width of the bonding element 68 forming the clamping area 72 will clamp the beam lead preventing it from deflecting downward (shown at 65) and force the beam lead to assume the position shown at 21a thereby preventing beam lead from shorting to the substrate.

Although the preferred embodiments of the present invention have been illustrated and there forms described in detail, it will be readily apparent to those skilled in the art that various modifications may be made therein without departing from the spirit of the invention or from the scope of the appended claims.

What is claimed is:

1. A bonding apparatus for bonding a plurality of beam leads each including a bonding end randomly varying in thickness, said bonding ends positioned in relation to other ones of said beam lead bonding ends and positioned to engage a different one of a corresponding plurality of bonding bumps formed on a first side of a substrate, each of said bumps randomly varying in height, said substrate subject to cracking when subjected to a predetermined bonding force and further including a second side, said apparatus comprising:

a bonding element positioned to simultaneously engage said beam lead bonding ends and adapted to apply at least a bonding force to said ends;

a base including a support surface positioned proximate to said substrate second side and adapted to support said substrate;

a compliant pad positioned on said base support surface, said pad compressing in response to the application of bonding force by said bonding element to prevent said bonding ends and bonding bumps from exerting said predetermined bonding force on said substrate and a protective layer positioned on said pad, wherein said protective layer has an upper surface for directly supporting said substrate and is resistant to laceration by a sharp edge of said substrate and thus protects said pad from laceration.

2. A bonding apparatus as claimed in claim 1, wherein: said base includes a central bore connected to a source of vacuum, said protective layer is of wire mesh construction and said pad includes a central bore coincident with said base central bore, said vacuum source activated to retain said substrate against said protective layer.

3. A bonding apparatus as claimed in claim 1, wherein: said pad comprises a sealed bladder containing therein a material which is liquid and incompressible in operation, said material filled bladder compliantly adjusting to unequal thicknesses of said bonding ends and bonding bumps to prevent said predetermined force from being exerted on said substrate.

4. A bonding apparatus as claimed in claim 1, wherein: said protective layer comprises wire mesh.

5. A bonding apparatus as claimed in claim 4, wherein: said wire mesh is of stainless steel construction.

6. A bonding apparatus for bonding a plurality of beam leads each including a bonding end randomly varying in thickness, said bonding ends positioned in relation to other ones of said beam lead bonding ends and positioned to engage a different one of a corresponding plurality of bonding bumps formed on a first side of a substrate, each of said bumps randomly varying in height, said substrate subject to cracking when subjected to a predetermined bonding force and further including a second side, said apparatus comprising:

a bonding element positioned to simultaneously engage said beam lead bonding ends and adapted to apply at least a bonding force to said ends;

a base including a support surface positioned proximate to said substrate second side and adapted to support said substrate;

a compliant means positioned on said base support surface, said compliant means compressing in response to the application of bonding force by said bonding element to prevent said bonding ends and bonding bumps from exerting said predetermined bonding force on said substrate; and a thermally conductive plate mounted on said compliant means, said conductive plate having an upper surface for directly supporting said substrate and for receiving bonding energy from a predetermined one of said bonding bumps through said substrate, and distributing said received bonding energy to different ones of said bonding bumps through said substrate.

7. A bonding apparatus as claimed in claim 6, wherein: said apparatus includes a retainer of inverted L-shaped cross-section attached to said compliant means, said retainer retaining said protective layer in position and positioning said thermally conductive layer and said substrate relative to said base.

8. A bonding apparatus as claimed in claim 7, wherein: said bonding element is formed to overlap said retainer, said overlap between said bonding element and said retainer forming a beam lead clamping area, said clamping area clamping said beam lead upon bonding of said beam leads to said bonding bumps to prevent deflection of said beam leads and contact of said beam leads with said substrate.

* * * * *